(12) United States Patent
Yagyu et al.

(10) Patent No.: US 11,462,746 B2
(45) Date of Patent: Oct. 4, 2022

(54) MULTILAYER STRUCTURE AND METHOD OF FORMING THE SAME

(71) Applicant: FLOSFIA INC., Kyoto (JP)

(72) Inventors: Shingo Yagyu, Kyoto (JP); Takuto Igawa, Kyoto (JP); Toshimi Hitora, Kyoto (JP)

(73) Assignee: FLOSFIA INC., Kyoto (JP)

( * ) Notice: Subject to any disclaimer, the term of this patent is extended or adjusted under 35 U.S.C. 154(b) by 260 days.

(21) Appl. No.: 15/941,165

(22) Filed: Mar. 30, 2018

(65) Prior Publication Data

US 2018/0287169 A1    Oct. 4, 2018

(30) Foreign Application Priority Data

Mar. 31, 2017    (JP) .............................. JP2017-073296

(51) Int. Cl.

| | |
|---|---|
| *H01M 8/0228* | (2016.01) |
| *H01M 8/026* | (2016.01) |
| *H01M 8/0206* | (2016.01) |
| *C23C 16/448* | (2006.01) |
| *C23C 16/40* | (2006.01) |

(Continued)

(52) U.S. Cl.
CPC ......... *H01M 8/0228* (2013.01); *C23C 16/405* (2013.01); *C23C 16/407* (2013.01); *C23C 16/4486* (2013.01); *H01M 8/026* (2013.01); *H01M 8/0206* (2013.01); *H01M 8/0215* (2013.01); *H01M 8/021* (2013.01); *H01M 2008/1095* (2013.01)

(58) Field of Classification Search
None
See application file for complete search history.

(56) References Cited

U.S. PATENT DOCUMENTS

| 9,062,384 B2 * | 6/2015 | Wang ........................ C23C 8/10 |
| 2004/0081881 A1 * | 4/2004 | Vyas ................... H01M 8/1023 |
| | | 429/509 |

(Continued)

FOREIGN PATENT DOCUMENTS

| CN | 101521281 | 9/2009 |
| CN | 105386008 | 3/2016 |

(Continued)

OTHER PUBLICATIONS

First Office Action dated Apr. 27, 2021 in corresponding in Chinese Application No. 201810293622.6 with English translation.

(Continued)

*Primary Examiner* — Wyatt P McConnell
(74) *Attorney, Agent, or Firm* — Wenderoth, Lind & Ponack, L.L.P.

(57) ABSTRACT

In a first aspect of a present inventive subject matter, a multilayer structure includes a base with a surface and an electrically-conductive metal oxide film that is positioned directly or via another layer on the base. At least a part of the surface of the base contains as a major component at least one selected from the group of copper, copper alloy, aluminum, aluminum alloy, magnesium, magnesium alloy, and stainless steel. The electrically-conductive metal oxide film is 30 nm or more in thickness. The multilayer structure is electrically-conductive and has a contact resistance that is 100 mΩcm$^2$ or less.

8 Claims, 7 Drawing Sheets

(51) Int. Cl.
*H01M 8/0215* (2016.01)
*H01M 8/10* (2016.01)
*H01M 8/021* (2016.01)

(56) References Cited

U.S. PATENT DOCUMENTS

| | | | |
|---|---|---|---|
| 2006/0105218 A1 | 5/2006 | Ishikawa et al. | |
| 2006/0134501 A1* | 6/2006 | Lee | H01M 8/026 429/457 |
| 2007/0003815 A1* | 1/2007 | Vyas | H01M 8/0204 429/450 |
| 2008/0233456 A1 | 9/2008 | Ishikawa et al. | |
| 2009/0214927 A1* | 8/2009 | Dadheech | H01M 8/0228 429/434 |
| 2010/0273095 A1* | 10/2010 | Li | H01M 8/023 429/528 |
| 2013/0039843 A1 | 2/2013 | Shirahata et al. | |
| 2016/0060788 A1 | 3/2016 | Oda et al. | |
| 2016/0305011 A1* | 10/2016 | Wang | C23F 1/26 |
| 2018/0287169 A1* | 10/2018 | Yagyu | C23C 16/405 |
| 2019/0165383 A1* | 5/2019 | Fujita | H01M 8/021 |

FOREIGN PATENT DOCUMENTS

| | | |
|---|---|---|
| JP | 2006-156386 | 6/2006 |
| JP | 2007-048753 | 2/2007 |
| JP | 2007-246337 | 9/2007 |
| JP | 2014-67491 | 4/2014 |
| JP | 2016-020535 | 2/2016 |
| JP | 2017-199535 | 11/2017 |
| WO | 2011/151889 | 12/2011 |

OTHER PUBLICATIONS

Japanese Office Action dated Dec. 21, 2021 in corresponding Japanese Patent Application No. 2018-065787 with English translation.

* cited by examiner

MULTILAYER STRUCTURE AND METHOD OF FORMING THE SAME

CROSS-REFERENCE TO RELATED INVENTION

This application is a new U.S. patent application that claims priority benefit of Japanese patent application No. 2017-073296 filed on Mar. 31, 2017, the disclosures of which is incorporated herein by reference in its entirety.

BACKGROUND OF THE INVENTION

Field of the Invention

The present disclosure relates to a multilayer structure that is electrically conductive. Also, the present disclosure relates to a multilayer structure that is a separator of a fuel cell. Furthermore, the present disclosure relates to a fuel cell. Also, the present disclosure relates to a method of forming a multilayer structure.

Description of the Related Art

Multilayer structures have been suggested as separators of fuel cells in following publications, for example. Polymer electrolyte fuel cell separator, for example, has an electrical conductivity to collect power (electricity) which is generated in each single cell by electrically connecting the single cell. The polymer electrolyte fuel cell separator also has a flow path for fluid and gas on its surface, in order to supply fuel gas or oxidizing gas to the cell plane or in order to discharge water, which is generated on the cathode side, with reacted-air. Also, the separator is required to have characteristics such as air tightness for preventing mixing of fuel gas and air, and corrosion resistance for under power generation environment.

Materials used for the separator mainly includes, for example, a carbon-based material and a metal material. A separator using the carbon-based material is excellent in corrosion resistance but tends to be insufficient in electrical conductivity. Also, in order to obtain sufficient strength and air tightness, the separator using the carbon-based material requires a certain thickness, which results in increase in size of the separator and the fuel cell. Furthermore, the carbon-based material tends to increase in cost. On the other hand, a separator using a metal material is easier to be processed and to be reduced in thickness with sufficient robustness and air tightness. However, a separator made of a metal material tends to be corrosive. As a separator which requires to have a sufficient corrosion resistance, a separator using stainless steel has been considered. The separator using stainless steel may be good in corrosion resistance but normally has a passive film on its surface, which causes an increase of contact resistance. Also, even a separator of stainless steel with a good corrosion resistance tends to be ionized and eluted when used in a corrosive substance (a strong acid) that is generated in operating environment of a fuel cell. Accordingly, even with a separator of stainless steel requires a surface treatment to be resistant to corrosion and to be electrical conductive as a separator used in such a severe condition.

It is open to the public that a metal separator for a fuel cell including a metal substrate having reactant flow pathways and an electro-conductive anti-corrosion layer. The electro-conductive anti-corrosion coating layer covers the surface of the metal substrate on which the reactant flow pathways are formed. The coating layer may include metal carbides, metal oxides, and metal borides. A metal layer for improving adherence is formed between the surface of the metal substrate on which the reactant flow pathways are formed, and the electro-conductive anti-corrosion coating layer (For reference, see Japanese Unexamined Patent Application Publication No. 2006-156386).

Also, it is open to the public that a method of forming a protective film on a surface of a substrate, which consists of an alloy or an oxide containing Cr, and the substrate is used for a fuel cell. When the protective film is formed as a first electrodeposition coating film, a mixture of anionic resin containing more than 30 mass percent of metal oxide fine particles in solid content is used. Also, the method includes a washing process of the first electrodeposition coating film. After the washing process of the first electrodeposition coating film, a second electrodeposition coating film is formed on the first electrodeposition coating film. Then, the first and second electrodeposition coating films are sintered to burn off resin components of the first and second electrodeposition coating films to form a protection film consisting of metal oxide. (For reference, see Japanese Unexamined Patent Application Publication No. 2014-067491).

SUMMARY OF THE INVENTION

In a first aspect of a present inventive subject matter, a multilayer structure includes a base with a surface and an electrically-conductive metal oxide film that is positioned directly or via another layer on the base. At least a part of the surface of the base contains as a major component at least one selected from among copper, copper alloy, aluminum, aluminum alloy, magnesium, magnesium alloy, and stainless steel. The electrically-conductive metal oxide film is 30 nm or more in thickness. The multilayer structure is electrically-conductive and has a contact resistance that is 100 mΩcm$^2$ or less.

Also, it is suggested that the electrically-conductive metal oxide film may include two or more layers.

It is suggested that the electrically-conductive metal oxide film may include at least one metal selected from the group consisting of tin, zinc, chromium, and indium.

Also, it is suggested that the at least the part of the surface of the base may contain stainless steel as the major component.

Furthermore, the base may have a plate shape, and according to an embodiment, the electrically-conductive oxide film may be positioned directly or via another layer on both sides of the base.

It is suggested that the at least the part of the surface of the base has an uneven shape.

In addition, the multilayer structure may be a separator of a fuel cell, according to an embodiment.

In a second aspect of a present inventive subject matter, a method of forming a metal oxide film may include generating a mist by atomizing a raw-material solution containing a metal, carrying the mist onto a base by a carrier gas, and heating the mist to form the metal oxide film on the base by thermal reaction. At least a part of a surface of the base that contains as a major component at least one selected from the group of copper, copper alloy, aluminum, aluminum alloy, magnesium, magnesium alloy, and stainless steel. The metal oxide film is electrically-conductive.

In a third aspect of a present inventive subject matter, a method of forming a fuel cell separator may include generating a mist by atomizing a raw-material solution containing a metal, carrying the mist onto a base by a carrier gas, and heating the mist to form the metal oxide film on the base by thermal reaction. At least a part of a surface of the base has an uneven shape, and the uneven shape is a flow path pattern, and the metal oxide film is formed to be electrically-conductive.

DETAILED DESCRIPTION OF EMBODIMENTS

As used herein, the term "and/or" includes any and all combinations of one or more of the associated listed items.

Also, as illustrated in the figures submitted herewith, some sizes of structures or portions may be exaggerated relative to other structures or portions for illustrative purposes.

According to a first aspect of a present inventive subject matter, a multilayer structure includes a base with a surface, and an electrically-conductive metal oxide film that is positioned directly or via another layer on the base.

The base may be made of a carbon-based material, which appears to be excellent in corrosion resistance but appears to be insufficient in electrical conductivity. Also, if the base is used as a separator of a fuel cell, the base made of a carbon-based material may require to be increased in thickness to obtain sufficient strength and airtightness.

Consequently, according to embodiments of the multilayer structure of the present inventive subject matter, at least a part of the surface of the base includes a metal material as a major component. The metal material may be at least one selected from among copper, copper alloy, aluminum, aluminum alloy, magnesium, magnesium alloy, and stainless steel. Also, the electrically-conductive metal oxide film is 30 nm or more in thickness. The multilayer structure is electrically-conductive and has a contact resistance that is 100 m$\Omega$cm$^2$ or less.

Figure 1:
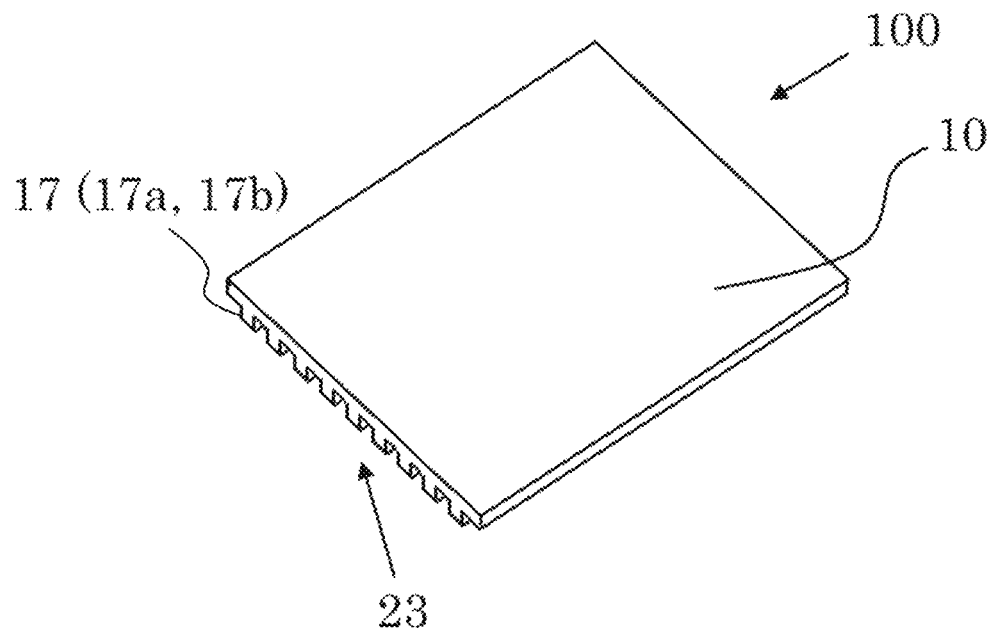
FIG. 1 shows a schematic perspective view of a multilayer structure according to a first embodiment of a present inventive subject matter.
Figure 2:
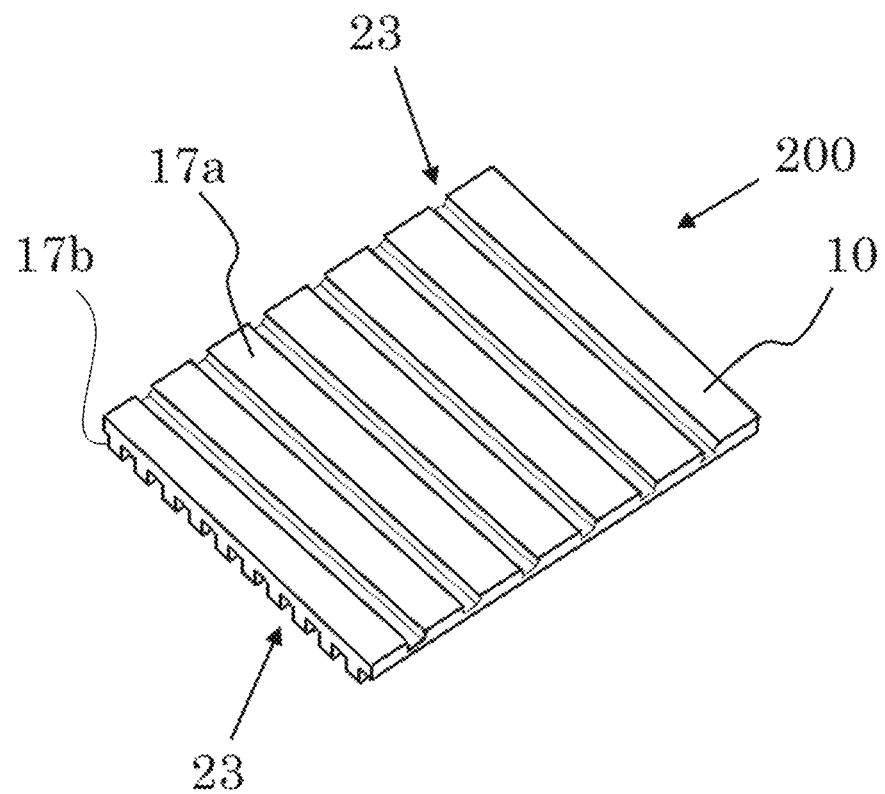
FIG. 2 shows a schematic perspective view of a multilayer structure according to a second embodiment of a present inventive subject matter.

FIG. 1 shows a schematic perspective view of a multilayer structure according to a first embodiment of a present inventive subject matter. The multilayer structure 100 includes a base 10 with a surface
and an electrically-conductive metal oxide film 17 that is positioned directly or via another layer on the base 10. At least a part of the surface of the base 10 contains as a major component at least one selected from among copper, copper alloy, aluminum, aluminum alloy, magnesium, magnesium alloy, and stainless steel.

The electrically-conductive metal oxide film 17 is 30 nm or more in thickness. The multilayer structure is electrically-conductive and has a contact resistance that is 100 m$\Omega$cm$^2$ or less.

The multilayer structure 100 may have a rectangular shape in plan view. Also, the base 10 of the multilayer structure 100 may have an uneven shape 23 on at least a part of a surface.

In this embodiment, the base 10 of the multilayer structure 100 includes a first surface and a second surface that is an opposite side of the first surface, and the second surface has an uneven shape 23. The first surface of the base 10 may be a flat surface.

Figure 7:
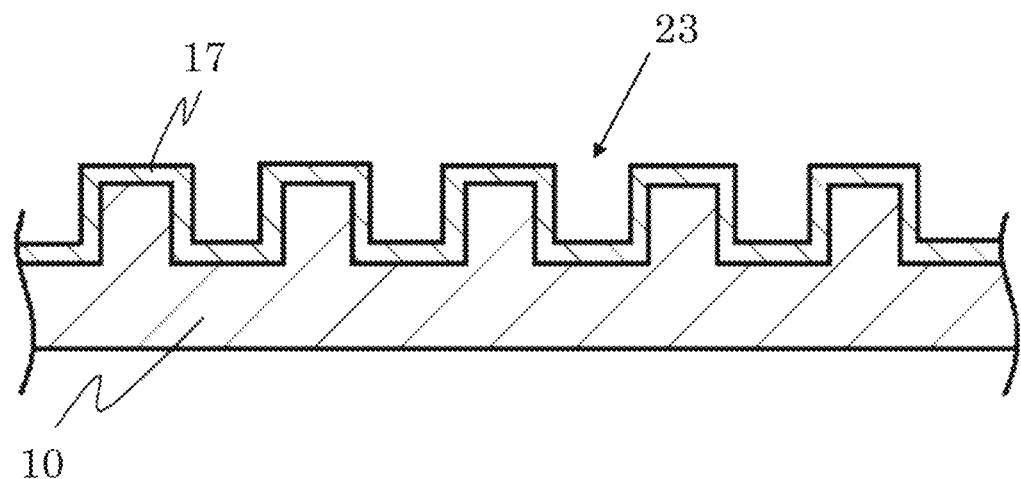
FIG. 7 shows a schematic view of a multilayer structure according to an embodiment of a present inventive subject matter.

The electrically-conductive metal oxide film 17 may be arranged on the second surface that has the uneven shape on that the electrically-conductive metal oxide film is arranged. The metal oxide film 17 may be a single layer, as shown in FIG. 7. The electrically-conductive metal oxide film 17 is 30 nm or more in thickness even on the uneven shape of the base 10 to be a protective film for the base 10. The base 10 with the electrically-conductive metal oxide film 17 that is 30 nm or more in thickness and closely adhered on the base 10 is resistant to corrosion even when the multilayer structure 100 is used as a separator of a fuel cell.

Figure 8:
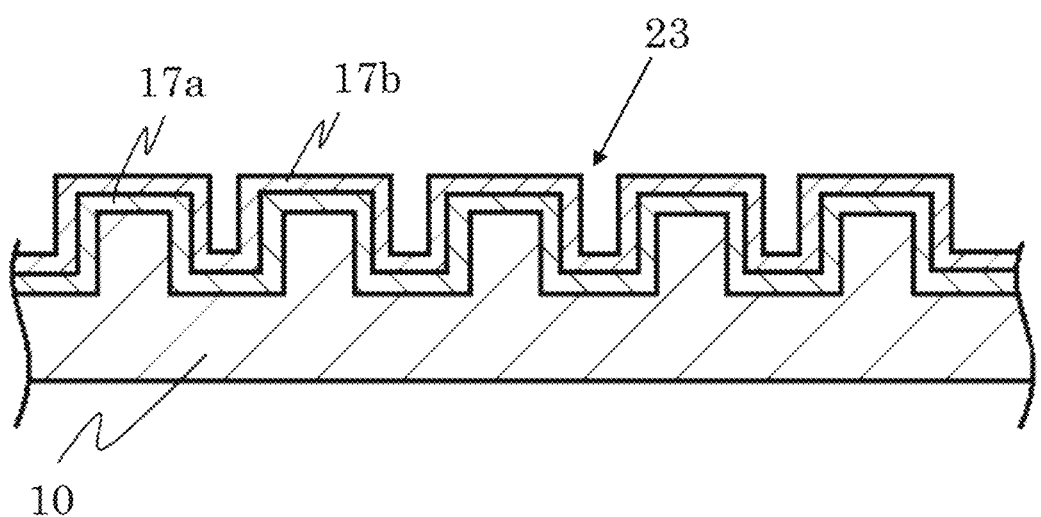
FIG. 8 shows a schematic view of a multilayer structure according to an embodiment of a present inventive subject matter.

Also, the electrically-conductive metal oxide film 17 may include two or more layers. As shown in FIG. 8, for example, the electrically-conductive metal oxide film 17 includes a first layer 17a that is directly arranged on a base 10 and a second layer 17b that is arranged on the first layer 17a.

Figure 11:
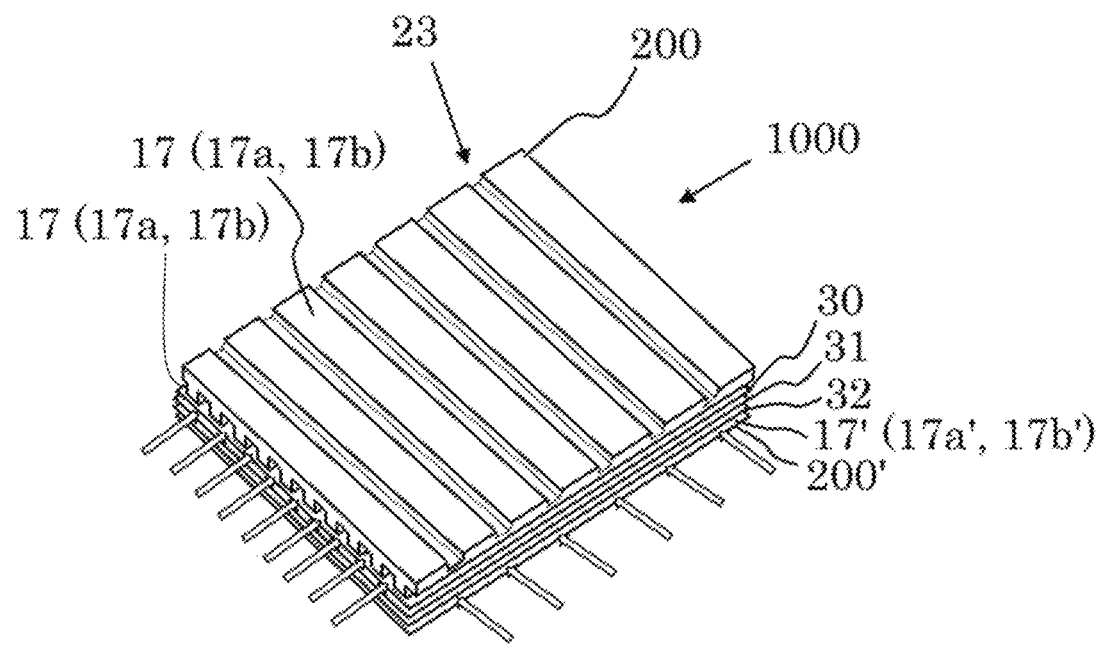
FIG. 11 shows a schematic diagram of a fuel cell according to an embodiment of a present inventive subject matter.

Furthermore, it is suggested that the multilayer structure may be a separator of a fuel cell 1000 which includes an electrolyte 31, a cathode (positive) 30 positioned at a first side of the electrolyte 31, and an anode (negative) 32 positioned at a second side of the electrolyte 31, as shown in FIG. 11, for example. The electrolyte 31 allows positively charged hydrogen ions (protons) to move between the two sides of the fuel cell. The fuel cell 1000 may include a first separator 200 with an uneven shape that faces the cathode 30 and a second separator 200' with an uneven shape that faces the anode 32. The fuel cell 1000 may be a polymer electrolyte fuel cell. The first separator 200 and the second separator 200' are electrically conductive to collect electrical power which is generated in a single cell by electrically connecting the cell. The first separator 200 may include a flow path for fluid and/or gas on at least one surface of the first separator 200. The second separator 200' may include a flow path for fluid and/or gas on at least one surface of the second separator 200'. The first separator 200 and the second separator 200' each include the electrically-conductive metal oxide film 17(17') formed to have 30 nm or more in thickness even on the uneven shape of the base 10. The electrically-conductive metal oxide film 17(17') is able to be a protective film of a base containing a metal. The uneven shape 23 of the first separator 200 may be a flow path pattern for air (oxygen) and/or water, for example. The uneven shape 23 of the second separator 100' may be a flow path pattern for fuel gas and/or unused fuel, for example. The metal oxide film 17(17') may be a single layer according to an embodiment of a present inventive subject matter. Also, according to another embodiment of a present inventive subject matter, the metal oxide film 17(17') may include two or more layers 17a(170, 17b(170. The separators are configured to separate a path for a fuel gas from a path for air (oxygen).

Inventors of a present inventive subject matter suggest a method of forming a metal oxide film on a base, and the metal oxide film is configured to be a protective film of the base. According to an embodiment of a present inventive subject matter, a method of forming a metal oxide film includes generating a mist by atomizing a raw-material solution containing a metal, carrying the mist onto a base by a carrier gas, and heating the mist to form the metal oxide film on the base by thermal reaction. Compared to conventional methods, this method facilitates to obtain a metal oxide film uniformly formed on a base even on an uneven shape, and a multilayer structure with layers that are closely adhered even on an uneven shape, even if layers of the multilayer structure contain different metals. At least a part of a surface of the base contains as a major component at least one selected from the group of copper, copper alloy, aluminum, aluminum alloy, magnesium, magnesium alloy, and stainless steel. The metal oxide film is electrically-conductive.

<Raw Material Solution>

The raw material solution is not particularly limited as long as containing a metal and able to be atomized. The raw material solution may contain inorganic material or organic material, either. The metal is not particularly limited and may be a metal simple substance or a metal compound. According to an embodiment of a present inventive subject matter, the metal is preferably at least one selected from metals of Period 3 to Period 5 of the periodic table. As a metal to be contained in the raw material solution, the metal may be more preferably selected from metals of Period 4 or Period 5 of the periodic table.

Examples of the metals of Period 3 of the periodic table include magnesium (Mg), aluminum (Al), silicon (Si), and phosphorus (P). Examples of the metals of Period 4 of the periodic table include titanium (Ti), chromium (Cr), manganese (Mg), iron (Fe), cobalt (Co), nickel (Ni), copper (Cu), zinc (Zn), and gallium (Ga). Examples of the metals of Period 5 of the periodic table include zirconium (Zr), niobium (Nb), molybdenum (Mo), ruthenium (Ru), rhodium (Rh), palladium (Pd), silver (Ag), indium (In), and tin (Sn).

According to an embodiment of the present inventive subject matter, the metal is preferably at least one selected from the group consisting of tin, zinc and chromium. Furthermore, metal content in the raw material solution may be preferably in a range of 0.001% to 80% by weight, and further preferably in a range of 0.01% to 80% by weight.

Also, according to an embodiment of the present inventive subject matter, the metal to be contained in a raw material solution is preferably different from a metal contained in the base. A multilayer structure including an electrically-conductive metal oxide film containing a first metal and arranged on a base that contains a second metal as a major component may enhance electrical characteristics such as contact resistance and characteristic stability if the first metal is different from the second metal. The first metal may be at least one selected from the group of tin, zinc, chromium, and indium. The first metal is further preferably at least one selected from the group consisting of tin, zinc, and chromium. Also, the second metal may be selected at least one from the group of copper, copper alloy, aluminum, aluminum alloy, magnesium, magnesium alloy, and stainless steel.

According to an embodiment of the present inventive subject matter, a raw material solution containing the metal in the form of complex or salt, dissolved and/or dispersed in an organic solvent or water may be used. Examples of the form of the complex may include acetylacetonate complexes, carbonyl complexes, amine complexes, and hydride complexes. Also, examples of the salt may include organic metal salts (e.g., metal acetate, metal oxalate, metal citrate, etc.), metal sulfide salt, metal nitrate salt, metal phosphate salt, and metal halide salt (e.g., metal chloride salt, metal bromide salt, metal iodide salt, etc.).

A solvent of the raw-material solution is not particularly limited, and thus, the solvent may be an inorganic solvent that includes water. The solvent may be an organic solvent that includes alcohol. The solvent may be a mixed solvent of the inorganic solvent and the organic solvent. According to an embodiment of a present inventive subject matter, the solvent preferably contains water, and further preferably is a mixed solvent of water and alcohol. According to an embodiment of a present inventive subject matter, the solvent is most preferably water. The term "water" here may include, for example, pure water, ultrapure water, tap water, well water, mineral water, hot spring water, spring water, fresh water and ocean water. According to an embodiment of the present inventive subject matter, ultrapure water is preferable.

The raw-material solution may contain hydrohalic acid and/or an oxidant as an additive. Examples of the hydrohalic acid may include hydrobromic acid, hydrochloric acid, hydroiodic acid. Among all, hydrobromic acid or hydroiodic acid is preferable. Examples of the oxidant may include hydrogen peroxide ($H_2O_2$), sodium peroxide ($Na_2O_2$), barium peroxide ($BaO_2$), and benzoyl peroxide ($C_6H_5CO)_2O_2$, hypochlorous acid (HClO), perchloric acid, nitric acid, ozone water, and organic peroxides that include peracetic acid and nitrobenzene.

According to an embodiment of a present inventive subject matter, the raw-material solution preferably contains a dopant, which is used to control electrical conductivity of a metal oxide. Without using ion implantation, it is possible to obtain an electrically-conductive metal oxide film and also to give electrical conductivity to the base, according to an embodiment of a method of a present inventive subject matter. The dopant is not particularly limited as long as an object of a present inventive subject matter is not interfered with. Examples of the dopant may include tin, germanium, silicon, titanium, zirconium, vanadium, niobium, antimony, tantalum, fluorine, chlorine, and cerium. The dopant concentration in general may be in a range of $1\times10^{16}/cm^3$ to $1\times10^{22}/cm^3$. The dopant concentration may be at a lower concentration of, for example, approximately $1\times10^{17}/cm^3$ or less. According to an embodiment of the present inventive subject matter, the dopant may be contained at a high concentration of, for example, $1\times10^{20}/cm^3$ or more.

<Base>

Abase is not particularly limited as long as at least a part of a surface of the base contains as a major component at least one selected from the group of copper, copper alloy, aluminum, aluminum alloy, magnesium, magnesium alloy, and stainless steel. Also, according to an embodiment of a present inventive subject matter, the base as a whole may contain at least one selected from the group of copper, copper alloy, aluminum, aluminum alloy, magnesium, magnesium alloy, and stainless steel, as a major component. According to an embodiment of a present inventive subject matter, the at least the part of the surface of the base preferably contains as a major component stainless steel. Also, according to an embodiment of the present inventive subject matter, all of the surface of the base further preferably contains as a major component stainless steel. Furthermore, according to an embodiment of a present inventive subject matter, the base most preferably contains as a major component stainless steel, as a whole. The term "major component" herein means that the major component occupies 50% or more of all components contained in the at least the part of the surface of the base by atomic ratio. According to an embodiment, the term "major component" herein means that the major component occupies 50% or more of all components contained in the base as a whole, by atomic ratio. According to an embodiment of a present inventive subject matter, the major component occupies preferably 70% or more, and further preferably 90% or more. The stainless steel may occupy 100%, by atomic ratio, of the at least the part of the surface of the base. The stainless steel is not particularly limited as long as an object of a present inventive subject matter is not interfered with, and the stainless steel may be a known stainless steel. Examples of the stainless steel may include ferritic stainless steel, martensitic stainless steel, and austenitic stainless steel. Examples of the ferritic stainless steel may include SUS430, SUS434, and SUS405. Examples of the martensitic stainless steel may include SUS403, SUS410, and SUS431. Examples of the austenitic stainless steel may include SUS201, SUS304, SUS304L, SUS304LN, SUS310S, SUS316, SUS316L, SUS317J1, SUS317J2, SUS321, SUS329J1, SUS836, and SUSXM7. According to an embodiment of a present inventive subject matter, the stainless steel preferably is austenitic stainless steel.

The base may be in any shape and is valid for all shapes. Examples of the shape of the base include a plate shape, a flat plate shape and a disk shape, a fibrous shape, a rod shape, a cylindrical shape, a prismatic shape, a tubular shape, a spiral shape, a spherical shape, and a ring shape. According to an embodiment of a present inventive subject matter, the base preferably has a plate shape. Also, according to an embodiment of the present inventive subject matter, it is preferable that the base has a plate shape, and the oxide film is formed on both sides of the base. Furthermore, according to an embodiment of the present inventive subject matter, at least a part of a surface of the base preferably has uneven shape. According to an embodiment of the present inventive subject matter, a metal oxide film is formed uniformly and with close adhesion even on such a base. It should be noted that the base may be a separator.

<An Uneven Shape of a Base>

The uneven shape may include a recessed portion. Also, the uneven shape may be a projected portion. Also, the uneven shape may include a combination of a recessed portion and a projected portion. The uneven shape may include a concave. The uneven shape may include a groove. The uneven shape may include a convex. Also, the uneven shape may include a regular recessed portion and/or a regular projected portion. Furthermore, the uneven shape may include an irregular recessed portion and/or an irregular projected portion. According to an embodiment of a present inventive subject matter, the uneven shape is preferably formed periodically, and further preferably, the uneven shape forms periodic and regular pattern.

Moreover, according to an embodiment of the present inventive subject matter, the uneven shape is not particularly limited as long as the uneven shape on which an electrically-conductive metal oxide film is arranged is able to be used as a flow path of gas and/or a fluid of a fuel cell, for example.

Examples of the periodic and regular pattern may include a stripe pattern, a dot pattern, a lattice-like pattern, and a mesh pattern. According to an embodiment of the present inventive subject matter, the periodic and regular pattern preferably is the stripe pattern, the dot pattern, or the lattice-like pattern. The flow path pattern is not particularly limited as long as the flow path pattern work as a flow path for fluid or gas, when the base is applied to as a fuel cell separator, by a known means. Examples of the flow path pattern may include serpentine type flow path pattern, which contains at least one flow path in a serpentine manner, parallel type pattern, which contains multi straight flow paths in a parallel manner, or a combination of the serpentine type flow path pattern and the parallel type flow path pattern. According to an embodiment of the present inventive subject matter, the flow path pattern is preferably the parallel type flow path pattern. A cross-sectional shape of the recessed portion and a cross-sectional shape of the projected portion are not particularly limited. Examples of a cross-sectional shape of the recessed portion and the projected portion may include a channel shape, a U-shape, a converted U-shape, corrugated shape, polygons including a triangle, a quadrangle (for example, a square, a rectangle or a trapezoid), and/or a polygon including a pentagon and a hexagon. Examples of a planar shape of the recessed portion and the projected portion may include a circle, an ellipse, a triangle, a quadrangle (for example, a square, a rectangle, or a trapezoid), and/or a polygon including a pentagon or a hexagon. According to an embodiment of the present inventive subject matter, the planar shape preferably is a rectangle.

A material component of the projected portion is not particularly limited and may be a known material. The material component of the projected portion may be an insulating material, an electrically-conductive material, or a semiconductor material. Also, the material component of the projected portion may be amorphous, single crystal, or polycrystalline. Examples of the material component of the projected portion include an oxide, nitride, a carbide of at least one selected from the group of silicon, germanium, titanium, zirconium, hafnium, tantalum, and tin, carbine, diamond, metal, and a mixture thereof. More specific examples of the material component of the projected portion includes $SiO_2$, SiN, or a silicon-containing compound that includes polycrystalline silicon as a major component, a metal that has a higher melting point than a growth temperature of the metal oxide film (for example, platinum, gold, palladium, iridium, ruthenium, and other known noble metals), a content of which in the projected portion is preferably 50% or more by composition ratio, according to an embodiment. Also, the content of the material component may be further preferably 70% or more according to an embodiment. Furthermore, the content of the material component may be most preferably 90% or more, by composition ratio, according to an embodiment. According to an embodiment of a present inventive subject matter, the material component of the projected portion is also preferably mask material that is removable after a growth of the metal oxide film. A removal method of the mask material is not particularly limited to, and a known method may be used. Examples of a method of removal the mask material include dry etching and wet etching.

A method of forming the projected portion may be a known method. Examples of the method of forming the projected portion include a photolithography, electron beam lithography, laser patterning, screen printing, etching (for example, dry etching or wet etching), and other known patterning methods. According to an embodiment of a present inventive subject matter, the projected portion preferably has a stripe pattern, mesh pattern or a lattice-like pattern, and further preferably has lattice-like pattern. The projected portion is also preferable to be a projected portion that is provided by processing the base. A method of processing the base is not particularly limited and a known processing method may be used. Examples of the method of processing the base include etching (for example, dry etching or wet etching), and press working.

The recessed portion is not particularly limited. The component material may be the same component as the projected portion. The recessed portion may be formed into the base. According to an embodiment of a present inventive subject matter, the recessed portion preferably has a stripe pattern, mesh pattern or a lattice-like pattern. A method of forming the recessed portion may be the same method as the method of forming the projected portion. The recessed portion may be a recessed portion that is provided by a mask material. It is also preferable that the recessed portion is a recessed portion that is provided by processing the base. A method of processing the base is not particularly limited and a known groove method may be used. A width, depth and a terrace width of the recessed portion are not particularly limited and may be set appropriately.

<Atomization Process>

At the atomization process, the raw material solution is prepared. The raw material solution may be atomized by a method described as follows, however, a method to atomize a raw material solution is not limited herein, and a known method to atomize a raw material solution may be used.

According to an embodiment of the present inventive subject matter, generating a mist by atomizing the raw material solution using ultrasonic vibration is preferable. The mist obtained by use of ultrasonic vibration have an initial rate of zero to be suspended in the air. The mist obtained using ultrasonic vibration is capable of being suspended in a space to be carried as a gas, is not blown like a spray, for example, and thus, is not damaged by collision energy. Accordingly, the mist obtained using ultrasonic vibration is preferable. The term "mist" herein may include droplets. The size of droplet may not be particularly limited and a droplet may be of approximately several mm, however, according to an embodiment of a present inventive subject matter, the size of droplet may be 50 μm or smaller. Also, according to an embodiment of a present inventive subject matter, the size of droplet may be in a range of 0.1 μm to 10 μm.

<Carrying Mist Process>

At the process for carrying mist, the mist is carried into a film-formation chamber by a carrier gas. According to an embodiment of a present subject matter, it is preferable that supplying the carrier gas to the mist to carry the mist into the film-formation chamber by the carrier gas and onto a base, then conducting the thermal reaction of the mist on the base to form a film. The term "film" here may include a layer. The term "film" here include two or more layers. This method gives a better cohesion of a film on the base and/or layers on the base even if the base has an uneven shape, compared to a method in that a mist is blown onto a base.

A carrier gas used in embodiments of a method is not limited as long as an object of a present inventive subject matter is not interfered with, and thus, the carrier gas may be an inert gas such as nitrogen and argon or an oxidizing gas such as oxygen and ozone. Also, the carrier gas may be a reducing gas that may be a hydrogen gas and/or a forming gas. The carrier gas may contain one or two or more gasses. Also, according to an embodiment of a method, a first carrier gas and a second carrier gas that is a diluted carrier gas at a reduced flow rate (e.g., 10-fold diluted carrier gas) may be used. The carrier gas may be supplied from one or more locations. While the flow rate of the carrier gas is not particularly limited, the flow rate of the carrier gas may be in a range of 0.01 to 20 L/min. According to an embodiment of the inventive subject matter, the flow rate of the carrier gas may be preferably in a range of 1 to 10 L/min. When a diluted carrier gas is used, the flow rate of the diluted carrier gas may be in a range of 0.001 to 10 L/min. Furthermore, according to an embodiment of an inventive subject matter, when a diluted carrier gas is used, the flow rate of the diluted carrier gas may be in a range of 0.1 to 5 L/min.

<Film-Formation Process>

At the film-formation process, a metal oxide film is formed on a base by a thermal reaction of the mist of the raw material solution. The term "thermal reaction" herein includes just a reaction of the mist by heat. Conditions of reaction are not particularly limited only if an object of a present inventive subject matter is not interfered with. In the film-formation process, the thermal reaction is conducted at an evaporation temperature or higher temperature of the evaporation temperature of the solvent of the raw material solution. During the thermal reaction, the temperature should not be too high. For example, the temperature during the thermal reaction may be 800° C. or less. The temperature during the thermal reaction is preferably 600° C. or less. According to an embodiment of a present inventive subject matter, the temperature during the thermal reaction is most preferably 500° C. or less. Also, the thermal reaction may be conducted in any atmosphere of a vacuum, a non-oxygen atmosphere, a reducing-gas atmosphere, and an oxygen atmosphere. Also, the thermal reaction may be conducted in any condition of under an atmospheric pressure, under an increased pressure, and under a reduced pressure. According to an embodiment of a present inventive subject matter, the thermal reaction is preferably conducted under an atmospheric pressure.

By forming the metal oxide film as described above, the metal oxide film may be formed on the base with cohesion, easily and industrially advantageously. Also, a thickness of the metal oxide film may easily be controlled by controlling a growth time. According to an embodiment of a present inventive subject matter, the metal oxide film is preferably a single-layer film. Also, according to another embodiment of a present inventive subject matter, the metal oxide film may include two or more layers.

Also, according to the film forming method described above, a multilayer structure may be obtained, that includes a base with a surface and an electrically-conductive metal oxide film that is positioned directly or via another layer on the base, at least a part of the surface of the base that contains as a major component at least one selected from the group of copper, copper alloy, aluminum, aluminum alloy, magnesium, magnesium alloy, and stainless steel, the electrically-conductive metal oxide film being 30 nm or more in thickness. The multilayer structure is electrically-conductive and has a contact resistance that is 100 mΩcm$^2$ or less. According to an embodiment of a method for forming a film, it is possible to obtain a multilayer structure with an electrically-conductive metal oxide film and a contact resistance that is 50 mΩcm² or less, which is preferable. Furthermore, according to another embodiment of a method for forming a film, it is possible to obtain a multilayer structure with an electrically-conductive metal oxide film and a contact resistance that is 20 mΩcm² or less, which is further preferable.

The electrically-conductive metal oxide film is not limited as long as the electrically-conductive metal oxide film contains an oxide of a metal. The electrically-conductive metal oxide film preferably contains the oxide of the metal as a major component. Examples of such a metal includes the metal described as the metal in the raw material solution. According to an embodiment of a present inventive subject matter, the electrically-conductive metal oxide film preferably contains at least one metal selected from the group of indium, tin, zinc, and chromium, and further preferably selected from the group of tin, zinc, and chromium. The term "major component" herein means, for example, in a case that the electrically-conductive metal oxide film contains $SnO_2$ as a major component, tin occupies 50% or more, by atomic ratio, of metal atoms in the film, preferably 70% or more, and further preferably 90% or more. According to an embodiment of the present inventive subject matter, the oxide of the metal contained in the electrically-conductive metal oxide film is preferably different from an oxide of the metal contained in the base as a major component, as a reason that the multilayer structure may be obtained, which is more excellent in electrical characteristics such as contact resistance, or characteristics stability. The oxide of the metal contained in the electrically-conductive metal oxide film is further preferably different from an oxide of the metal contained in the base.

FIG. 7 shows a schematic view of a multilayer structure according to an embodiment of a present inventive subject matter. The multilayer structure shown in FIG. 7 includes a base 10 including a surface, an uneven shape 23 formed on the surface of the base 10, an electrically-conductive metal oxide film 17 positioned on the surface of the base 10, the electrically-conductive metal oxide film 17 that has a thickness of 30 nm or more. An upper limit of the thickness of the electrically-conductive metal oxide film is not particularly limited. According to an embodiment of a present inventive subject matter, the thickness of the electrically-conductive metal oxide film is preferably 1 μm or less, further preferably 500 nm or less. According to an embodiment of a multilayer structure, an electrically-conductive metal oxide film is most preferably 100 nm or less, for a reason that a contact resistance of the electrically-conductive metal oxide film may be further reduced. A film forming method according to an embodiment of a present inventive subject matter is better in step coverage, so that such a thin film may be formed with good adhesion even on a base with an uneven shape.

FIG. 8 shows a schematic view of a multilayer structure according to an embodiment of a present inventive subject matter. The multilayer structure is different from the one in FIG. 7 in a point of which an electrically-conductive metal oxide film 17 is a multilayer film that includes at least two layers including a first electrically-conductive metal oxide film 17a arranged on a surface of a base 10 and a second electrically-conductive metal oxide film 17b arranged on the first electrically-conductive metal oxide film 17a. In case that the electrically-conductive metal oxide film is a crystal film, such a multilayer film may be preferable for a reason that the multilayer film has benefit of stress relaxation, so that not only a better crystal quality, but a better electrical conductivity of the electrically-conductive metal oxide film may be obtained. According to an embodiment of the present inventive subject matter, the multilayer film may be obtained, for example, by forming films in different condition (for example, in different growth temperatures).

Figure 9:
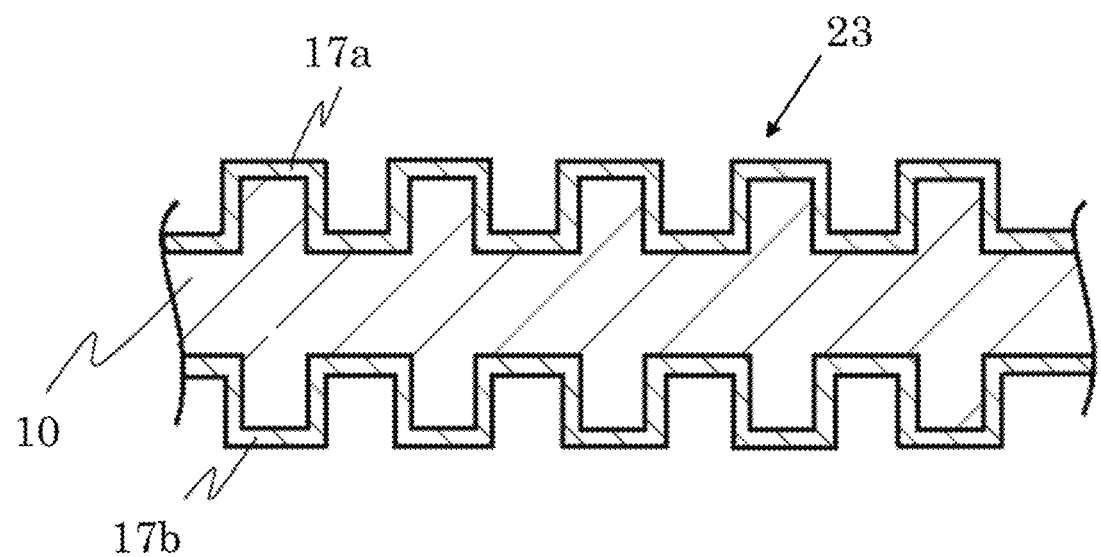
FIG. 9 shows a schematic view of a multilayer structure according to an embodiment of a present inventive subject matter.

FIG. 9 shows a schematic view of a multilayer structure according to another embodiment of a present inventive subject matter. The multilayer structure shown in FIG. 9 has a base 10 with an uneven shape 23 on its both sides including a first side and a second side. A first electrically-conductive metal oxide film 17a is formed on a first side of the base 10, and a second electrically-conductive metal oxide film 17 is formed on a second side of the base 10. According to a film forming method of a present inventive subject matter, the electrically-conductive metal oxide film 17 may be easily formed on the both sides of the base 10.

Examples of the multilayer structure may include a current collector, An electromagnetic wave shielding material, an electrode, a heat radiating plate, a heat radiating parts, electronics parts, semiconductor parts, a fuel cell separator, or other various components. The multilayer structures may be applied to an electronic device including the various components, according to ordinary method. The electronic device is not particularly limited. According to an embodiment of a present inventive subject matter, preferable examples of the electronic device may include an electronic device equipped with a central processing unit, such as a digital camera, a printer, a personal computer, or a cell phone. According to an embodiment of a present inventive subject matter, preferable examples of the electronic device may include an electronic device quipped with a power unit, such as a vacuum cleaner, or an iron. According to an embodiment of a present inventive subject matter, preferable examples of the electronic device may include a drive electronic, such as a motor, a drive mechanism, an electric car, electric flying object, small electric equipment, or a micro electro mechanical system.

Example I

1. Film-Formation Apparatus

Regarding a film-formation apparatus, a mist CVD apparatus 1 used in an embodiment of a method according to a present inventive subject matter is described below with FIG. 1. The mist CVD apparatus 1 includes a carrier gas source 2a, a first flow-control valve 3a that is configured to control a flow of carrier gas sent from the carrier gas source 2a. The mist CVD apparatus 1 may include a diluted carrier gas source 2b, and a second flow-control valve 3a that is configured to control a flow of diluted carrier gas sent from the diluted carrier gas source 2b. The mist CVD apparatus 1 further includes a mist generator 4 containing a raw material solution 4a, a container 5 containing water 5a, and an ultrasonic transducer 6 that is attached to a bottom of the container 5. The mixt generator 4 is arranged in water 5a contained in the container 5, and a mist is configured to be generated by atomization of the raw material solution 4a using ultrasonic vibration propagated through water 5a in the container to the raw material solution 4a. The mist CVD apparatus 1 further includes a film-formation chamber 7, a supply pipe 9 that connects the mist generator 4 and the film-formation chamber 7 to carry the mist generated in the mist generator 4 into the film-formation chamber 7 by a carrier gas. The mist CVD apparatus 1 further includes a hot plate 8 arranged in the film-formation chamber 7, and an air duct 11 that is configured to exhaust mist after a thermal reaction and/or gas that is used, from the film-formation chamber 7. Also, a base 10 may be set on the hot plate 8.

2. Preparation of a Raw-Material Solution

An aqueous solution containing tin and antimony was prepared such that an atomic ratio of tin to antimony that is 0.2:0.01, that would be a raw-material solution.

3. Film-Formation Preparation

Figure 3:
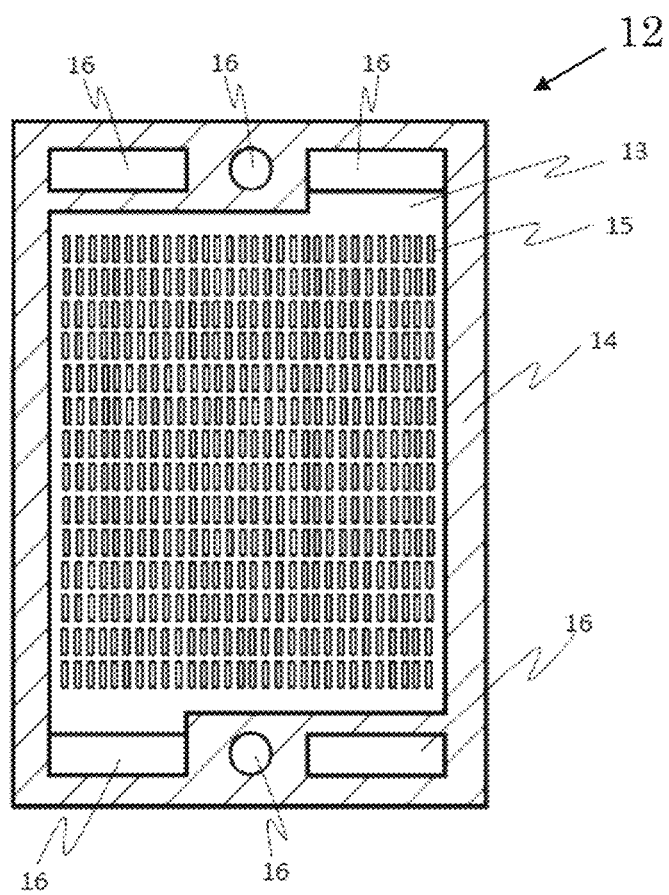
FIG. 3 shows a schematic diagram of a base made of stainless steel according to a present inventive subject matter.
Figure 4:
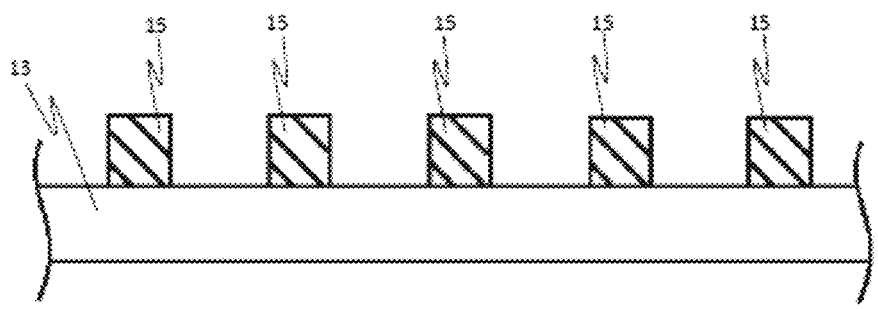
FIG. 4 shows a schematic sectional view of a base made of stainless steel according to a present inventive subject matter.

The raw-material solution 4a obtained at 2. the Preparation of the Raw-Material Solution was set in the mist generator 4. Then, a base made of stainless steel (SUS substrate) including an uneven shape on a surface of the SUS substrate was placed on the hot plate 8 as a base 10. The hot plate 8 was activated to raise the temperature of the base 10 up to 450° C. The first flow-control valve 3a to supply a carrier gas from the carrier gas source 2a and/or the second control valve 3b to supply a diluted carrier gas from the diluted carrier gas source 2b, which may be the source of carrier gas, were opened to carry carrier gas into the film-formation chamber 7 to replace the atmosphere in the film-formation chamber 7 with the carrier gas sufficiently. After the atmosphere in the film-formation chamber 7 was sufficiently replaced with the carrier gas, the flow rate of the carrier gas from the carrier gas source 2a was regulated at 0.5 L/min. and the diluted carrier gas from the diluted carrier gas source 2b was regulated at 4.5 L/min. In this embodiment, oxygen was used as the carrier gas. Also, the SUS substrate 13 used here as the base is schematically shown in FIG. 3. The SUS substrate 13 includes an uneven shape that are patterns arranged in parallel. The SUS substrate 13 further includes a flow path forming layer 14, a flow path wall 15, and a manifold 16 to supply a reaction gas and a coolant to each single cell. Also, a schematic sectional view of the SUS substrate is shown in FIG. 4. The SUS substrate may be used as a separator 12 of a fuel cell after an electrically-conductive metal oxide film is formed on a surface of the SUS substrate 13, for example.

4. Formation of a Film

Figure 10:
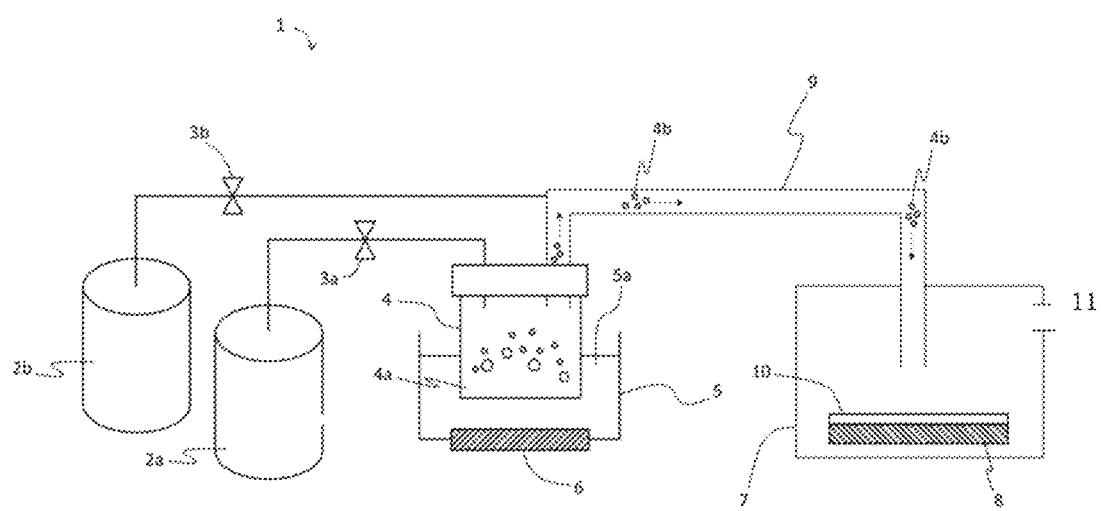
FIG. 10 shows a schematic diagram of a mist chemical vapor deposition (CVD) device to form a metal oxide film according to an embodiment of a multilayer structure.

The ultrasonic transducer 6 was then vibrated at 2.4 MHz, and the vibration propagated through the water 5a to the raw material solution 4a to atomize the raw material solution 4a to form a mist 4b. The mist 4b was sent through a supply pipe 9 with the carrier gas and introduced in the film-formation chamber 7. The mist was thermally reacted at 450° C. under atmospheric pressure in the film-formation chamber 7 to form a film on the SUS substrate as a base 10 shown in FIG. 10. The film that was obtained by a thermal reaction of the mist adjacent to the SUS substrate was an electrically-conductive metal oxide film with a thickness of 90 nm.

5. Evaluation

The electrically-conductive metal oxide film obtained at "4. Formation of a film" is closely adhered to the base that is the SUS substrate, even if the film contains a metal different from the SUS substrate. Also, a resistivity of the film was measured using 4-probe method, and the resistivity of the film was $7.7 \times 10^{-4}$ Ωcm.

Example II

Using same conditions as those used in Example I, except for three conditions of using a substrate made of stainless steel SUS304 (SUS 304 substrate), as a base, using aqueous solution containing chromium acetylacetonate as a raw-material solution with chromium that was 0.05 mol/L, and the temperature of film formation to be 400° C., an electrically-conductive metal oxide film was similarly obtained.

The film obtained in Example II was also closely adhered to the base that was the SUS304 substrate.

The First Test Example

A corrosion resistance test was conducted to the base made of stainless steel SUS304 on which the electrically-conductive metal oxide film was formed at Example II, in order to confirm a corrosion resistance of the electrically-conductive metal oxide film obtained according to a film forming method of a present inventive subject matter. In the corrosion resistance test, the base made of stainless steel SUS304 on which the electrically-conductive metal oxide film was formed at Example II and a base made of stainless steel SUS304 without a metal oxide film formed on the base, for comparison, were immersed in hydrofluoric acid. As a result, as for the base made of stainless steel SUS304 without the metal oxide film, for comparison, erosion of a surface of the base was observed immediately after the immersion in hydrofluoric acid. As for the base made of stainless steel on which the electrically-conductive metal oxide film was formed at Example II, even after a thirty-minutes immersion in hydrofluoric acid, a surface of the base on which the metal oxide film was formed was kept resistant to corrosion without causing corrosion.

The first test example revealed that a metal oxide film obtained according to a film forming method of the present inventive subject matter gives a better corrosion resistance to the base made of stainless steel. Also, Example I revealed that a metal oxide film according to a film forming method of the present inventive subject matter, by using a raw-material solution containing a dopant, becomes an electrically-conductive metal oxide film with electrical-conductivity that may be formed on the base of a separator.

Example III

According to the Example I, except for forming an electrically-conductive metal oxide film on both sides of the base, a multilayer structure was similarly obtained.

Example IV

According to conditions of the Example II, except for one condition of forming an electrically-conductive metal oxide film on both sides of the base made of stainless steel, a multilayer structure was similarly obtained.

Comparative Example I

According to conditions of the Example III, except for one condition of forming an electrically-conductive metal oxide film by sputtering, a multilayer structure was similarly obtained.

Comparative Example II

According to conditions of the Example III, except for one condition of forming an electrically-conductive metal oxide film by electroplating, a multilayer structure was similarly obtained.

The Second Test Example

Figure 5:
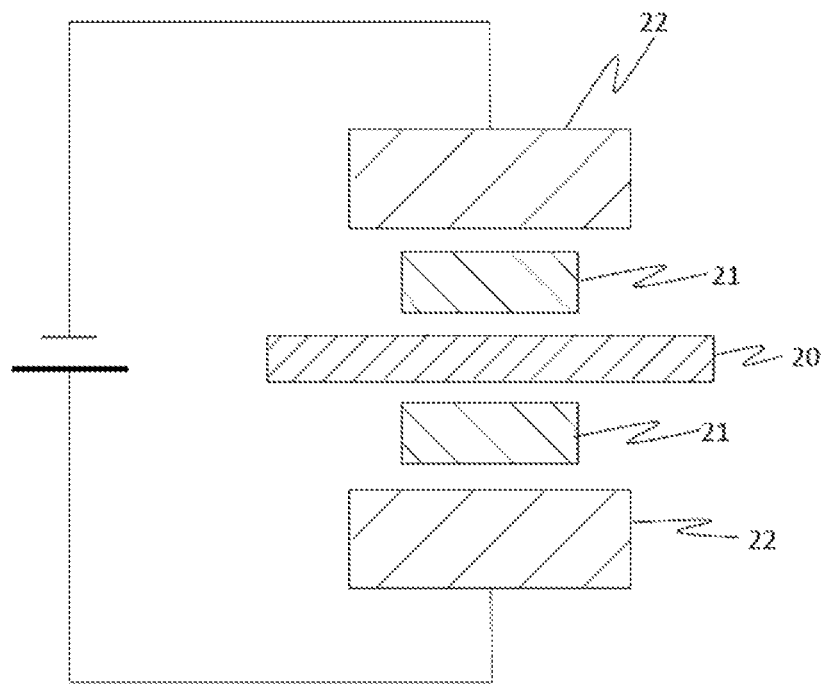
FIG. 5 shows a diagram illustrating a measuring apparatus that was used for measuring a contact resistance in a test example.

Regarding the multilayer structures obtained at the Example III, Example IV, Comparative example I, and Comparative example II, a contact resistance in the forming direction was measured. In particular, as shown in FIG. 5, a laminate, in which a multilayer structure 20 was sandwiched between a pair of gas diffusion substrates 21, was further sandwiched by a pair of catalyst layers 22. Then a power source was electrically connected with the pair of catalyst layers 22, and held with a load of 1 MPa to constitute a measuring apparatus. A constant current of 1 A was passed through the measuring apparatus and contact resistance ($m\Omega cm^2$) was calculated from a voltage value at that time. Table 1 shows a result of the second test example. In Table 1, "⊚" means a contact resistance that is 30 $m\Omega cm^2$ or less, "○" means a contact resistance that is in a range of 30 to 50 $m\Omega cm^2$, "x" means a contact resistance that is 50 $m\Omega cm^2$ or more.

TABLE 1

| | Film material | Base material | Film thickness (nm) | Contact resistance ($m\Omega cm^2$) |
|---|---|---|---|---|
| Example III | $SnO_2$ | Stainless steel | 90 | ⊚ |
| Example IV | $CrO_2$ | Stainless steel | 100 | ○ |
| Comparative example I | $SnO_2$ | Stainless steel | 80 | X |
| Comparative example II | $CrO_2$ | Stainless steel | 7 | ○ |

The First Reference Example

Figure 6:
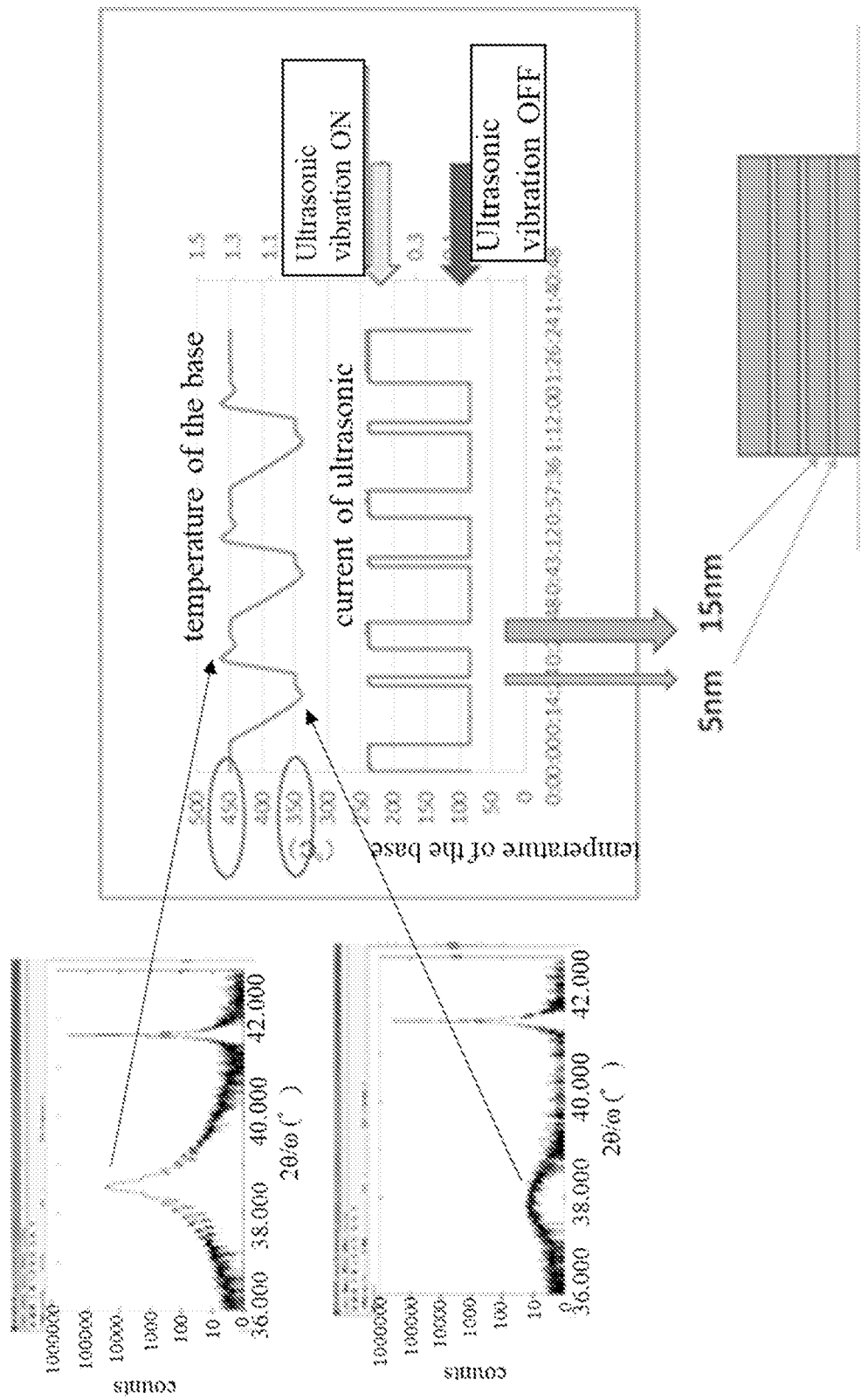
FIG. 6 shows a film forming condition and a result of an embodiment measured by an X-ray diffraction (XRD).

In purpose of confirming an electrical conductivity of a multilayer structure that includes at least two layers of a present inventive subject matter, according to conditions the Example I, except for two conditions of using a sapphire substrate instead of a substrate made of stainless steel, and thermal reaction was conducted in a condition shown in FIG. 6, a multilayer structure was similarly obtained. FIG. 6 also shows a measurement result of the multilayer structure obtained in the first reference example measured by an X-ray diffraction. An electrically-conductive metal oxide film of the multilayer structure obtained in the first reference example was better in contact resistance, than any other single layer-electrically-conductive metal oxide films that were obtained. The first reference example revealed that an electrically-conductive metal oxide layer (multilayer that has at least two layers) has a better electrical-conductivity.

The Second Reference Example

In purpose of confirming an electrical conductivity (resistivity), according to Example I, except for using an insulating substrate (glass substrate) in place of a substrate made of stainless steel, a multilayer structure was similarly obtained. The resistivity of an electrically-conductive metal oxide film of the multilayer structure obtained at the second reference example was measured using 4-probe method which revealed to be $2.0 \times 10^{-3}$ $\Omega cm$. The thickness of the electrically-conductive metal oxide film was 400 nm.

According to an embodiment of a present inventive subject matter, an electrically-conductive metal oxide film may be formed on the base with a good cohesion, easily and industrially advantageously. Therefore, an embodiment of the present inventive subject matter may be applied to various field in which a multilayer structure with a base and an electrically-conductive metal oxide film on the base is used. An embodiment of the present inventive subject matter may be especially useful for an electric apparatus including a current collector, an electromagnetic wave shielding material, an electrode, a heat radiating plate, a heat radiating part, an electronics part, a semiconductor part, a fuel cell separator, and other various parts.

REFERENCE NUMBER DESCRIPTION

1 a CVD (Chemical Vapor Deposition) apparatus
2a a carrier gas source
2b a diluted carrier gas source
3a a first flow-control valve
3b a second flow-control valve
4 a mist generator
4a a raw material solution
4b a mist
5 a container
5a water
6 an ultrasonic transducer
7 a film-formation chamber
8 a hot plate
9 a supply pipe
10 a base
11 an air duct
12 a separator
13 a base made of stainless steel (SUS substrate)
14 a flow path forming layer
15 a flow path wall
16 manifold
17 a conductive metal oxide film
17' a conductive metal oxide film
17a a first electrically-conductive metal oxide film
17a' a first electrically-conductive metal oxide film
17b a first electrically-conductive metal oxide film
17b' a first electrically-conductive metal oxide film
20 a multilayer structure
21 a gas diffusion substrate
22 a catalyst layer
23 an uneven shape of a base
30 a cathode (positive)
31 an electrolyte
32 an anode (negative)
100 a multilayer structure
100' a multilayer structure
200 a multilayer structure
1000 a fuel cell

What is claimed is:

1. A multilayer structure comprising:
   a base having a surface; and
   an electrically-conductive metal oxide film that has been deposited directly on the base, wherein
   at least a part of the surface of the base includes stainless steel as a major component,
   the electrically-conductive metal oxide film is crystalline,
   the electrically-conductive metal oxide film is 30 nm or more in thickness,
   the electrically-conductive metal oxide film includes an oxide that has at least one metal selected from the group consisting of tin, zinc, chromium, and indium, and
   the multilayer structure is electrically conductive and has a contact resistance that is 100 $m\Omega cm^2$ or less.

2. The multilayer structure of claim 1, wherein the electrically-conductive metal oxide film includes two or more layers.

3. The multilayer structure of claim 1, wherein the electrically-conductive metal oxide film includes an oxide of tin.

4. The multilayer structure of claim 1, further comprising another electrically-conductive metal oxide film, wherein
   the base has a plate shape,
   the electrically-conductive metal oxide film is positioned directly on one side of the base, and
   the another electrically-conductive metal oxide film is positioned directly or via another layer on another side of the base.

5. The multilayer structure of claim 1, wherein the at least the part of the surface of the base has an uneven shape on that the electrically-conductive metal oxide film with 30 nm or more in thickness is arranged.

6. A fuel cell comprising:
   the multilayer structure of claim 5, wherein the uneven shape is a flow path pattern of fluid or gas.

7. An electronic device comprising the multilayer structure of claim 1.

8. A multilayer structure comprising:
   a base having a surface; and
   an electrically-conductive metal oxide film that has been deposited directly on the base, wherein
   at least a part of the surface of the base includes as a major component at least one selected from among copper, copper alloy, magnesium, magnesium alloy, and stainless steel,
   the electrically-conductive metal oxide film is 30 nm or more in thickness,
   the electrically-conductive metal oxide film includes an oxide that has at least one metal selected from the group consisting of tin, zinc, chromium, and indium,
   the electrically-conductive metal oxide film is crystalline, and
   the multilayer structure is electrically conductive and has a contact resistance that is 100 m$\Omega$cm$^2$ or less.

* * * * *